(12) United States Patent
Kwon et al.

(10) Patent No.: US 6,732,643 B2
(45) Date of Patent: May 11, 2004

(54) METHOD FOR FORMING PATTERN USING PRINTING PROCESS

(75) Inventors: Young Wan Kwon, Seoul (KR); Myoung Kee Baek, Seoul (KR)

(73) Assignee: LG. Philips LCD Co., Ltd., Seoul (KR)

( * ) Notice: Subject to any disclaimer, the term of this patent is extended or adjusted under 35 U.S.C. 154(b) by 0 days.

(21) Appl. No.: 10/289,425

(22) Filed: Nov. 7, 2002

(65) Prior Publication Data

US 2003/0084796 A1 May 8, 2003

(30) Foreign Application Priority Data

Nov. 7, 2001 (KR) .................................. 10-2001-69200
Oct. 31, 2002 (KR) .................................. 10-2002-67254

(51) Int. Cl.[7] .............................................. B41M 1/10
(52) U.S. Cl. ....................................... 101/170; 101/150
(58) Field of Search ................................ 101/170, 163, 101/158, 153, 150, 488, 487, 483; 427/96; 438/597, 754

(56) References Cited

U.S. PATENT DOCUMENTS

| | | | | |
|---|---|---|---|---|
| 4,499,173 A | * | 2/1985 | Konstantinov et al. | 430/278.1 |
| 4,508,753 A | * | 4/1985 | Stepan | 427/555 |
| 5,259,926 A | | 11/1993 | Kuwabara et al. | 156/659.1 |
| 5,366,760 A | * | 11/1994 | Fujii et al. | 427/96 |
| 5,514,503 A | | 5/1996 | Evans et al. | 430/7 |
| 5,641,996 A | * | 6/1997 | Omoya et al. | 257/787 |
| 5,678,483 A | | 10/1997 | Johnson | 101/153 |
| 5,776,236 A | * | 7/1998 | Neuman et al. | 106/287.17 |
| 6,001,515 A | | 12/1999 | Evans et al. | 430/7 |
| 6,331,490 B1 | * | 12/2001 | Stevens et al. | 438/754 |
| 6,413,845 B1 | * | 7/2002 | Izumi et al. | 438/597 |
| 6,475,555 B2 | * | 11/2002 | Casey et al. | 427/96 |
| 2002/0009539 A1 | * | 1/2002 | Casey et al. | 427/96 |

FOREIGN PATENT DOCUMENTS

| | | |
|---|---|---|
| EP | 0 471 628 A1 | 2/1992 |
| JP | 3-280416 | 12/1991 |
| JP | 4-94115 | 3/1992 |
| JP | 4-239684 | 8/1992 |
| JP | 4-249189 | 9/1992 |
| JP | 4-296724 | 10/1992 |
| JP | 5-11270 | 1/1993 |
| JP | 6-202314 | 7/1994 |
| JP | 7-240523 | 9/1995 |
| KR | 1993-0002651 | 4/1993 |
| KR | 1996-0010514 | 8/1996 |

* cited by examiner

*Primary Examiner*—Anthony H. Nguyen
(74) *Attorney, Agent, or Firm*—Birch, Stewart, Kolasch & Birch, LLP

(57) ABSTRACT

Disclosed is a method for forming a pattern of a LCD device using a printing process, in which additive for detachment corresponding to detachment accelerant is coated in a groove of a cliché filled with ink, thereby easily transferring ink to a layer to be processed. A surface of the layer to be processed is processed chemically or physically to enhance an adhesive force with the ink.

19 Claims, 4 Drawing Sheets

← A PROGRESS DIRECTION OF SUBSTRATES

METHOD FOR FORMING PATTERN USING PRINTING PROCESS

This nonprovisional application claims priority under 35 U.S.C. § 119(a) on Patent Application Nos. 69200/2001 filed in Korea on Nov. 7, 2001 and 67254/2002 filed in Korea on Oct. 31, 2002 which are herein incorporated by reference.

BACKGROUND OF THE INVENTION

1. Field of the Invention

The present invention relates to a method for forming a pattern by a printing process, and particularly, to a method for forming a pattern by a printing process which can easily transfer ink to a transfer roll by adding additive for detachment to easily detach the ink in a groove of a cliché filled with ink at the time of patterning a circuit pattern such as a thin film transistor.

2. Description of the Background Art

Display devices, especially, flat panel display devices such as liquid crystal display devices are provided with an active device such as a thin film transistor in each pixel to drive the display devices. The method for driving the display devices is called an active matrix driving method. In the active matrix method, the active device is arranged at each pixel aligned in matrix form to drive corresponding pixels.

FIG. 1 is a view showing a LCD device using an active matrix method. The LCD device having the illustrated structure is a TFT-LCD using a thin film transistor (TFT) as an active device. As shown, each pixel of the TFT-LCD having N×M pixels arranged horizontally and vertically includes a TFT formed at an interconnected region between a gate line 4 to which an injection signal is applied from an external driving circuit and a data line 6 to which an image signal is applied. The TFT includes a gate electrode 3 connected to the gate line 4; a semiconductor layer 8 formed on the gate electrode 3 and activated in accordance with the injection signal being applied to the gate electrode 3; and source/drain electrodes 5 formed on the semiconductor layer 8. At a display region of the pixel 1, formed is a pixel electrode 10 connected to the source/drain electrodes 5 for driving a liquid crystal (not shown) by applying an image signal through the source/drain electrodes 5 in accordance with the semiconductor layer 8 being activated.

FIG. 2 shows a structure of a TFT arranged in each pixel. As shown, the TFT includes a substrate 20 made of a transparent insulating material such as glass; a gate electrode 3 formed on the substrate 20; a gate insulating layer 22 formed on the entire substrate 20 on which the gate electrode 3 is formed; a semiconductor layer 8 formed on the gate insulating layer 22 and activated in accordance with a signal being applied to the gate electrode 3; source/drain electrodes 5 formed on the semiconductor layer 8; and a passivation layer 25 formed on the source/drain electrodes 5 for protecting the device.

The source/drain electrodes 5 of the TFT are electrically connected to a pixel electrode formed in the pixel to drive the liquid crystal and then to display an image in accordance with a signal being applied to the pixel electrode through the source/drain electrodes 5.

In the active matrix type display device such as the liquid crystal display device, a size of each pixel is several tens of $\mu$m. Therefore, the active device such as the TFT arranged in the pixel has to be formed having a precision size of several $\mu$m. Moreover, as demand for a high picture quality display device such as a high picture quality digital television (HDTV) increases, more pixels have to be arranged on a screen of the same area. Accordingly, the active device patterns (including a gate line pattern and a data line pattern) arranged in the pixel have to be formed with more precision, as well.

To fabricate an active device such as a TFT, a pattern or a line of the active device has to be formed by a photolithography method by an exposure device. However, the photolithography method has a limitation in forming a complex pattern since a photo-resist is formed on a layer to be patterned and then an etching method by a photo process is used. Moreover, since an exposure region of the exposure device is limited at the time of photo-processing of the display device, the photo-processing has to be performed by dividing a screen so as to fabricate a display device of a large area. Accordingly, at the time of processing the divided region, not only matching of a precise location is difficult, but productivity also is lowered since the photo-processing has to be repeated many times.

SUMMARY OF THE INVENTION

Therefore, an object of the present invention is to provide a method for forming a pattern, in which a pattern is formed for a display device having a large area by a printing process.

Another object of the present invention is to provide a method for forming a pattern, in which a complex pattern can be formed by coating an additive for detachment in a groove of a cliché filled with ink at the time of printing and then detaching the ink smoothly from the cliché.

Still another object of the present invention is to provide a method for forming a pattern, in which transferred ink to a layer to be processed is prevented from being detached through chemical or physical surface processes of the layer to be formed on a substrate.

To achieve these and other advantages and in accordance with the purpose of the present invention, as embodied and broadly described herein, there is provided a method for forming a pattern comprising the steps of: coating an additive for detachment in a groove of a cliché (offset plate) corresponding to a location of a pattern to be formed; filling ink in the groove of the cliché coated by the additive for detachment; and transferring the ink filled in the groove of the cliché to the layer to be processed.

A method for transferring ink to the layer to be processed includes a method using a transfer roll and a method for directly contacting the cliché filled with ink to the layer to be processed.

The cliché is formed of a silicon group material such as $SiO_X$, and additive for detachment corresponding to detachment accelerant is coated in the groove. Therefore, the ink in the groove is smoothly detached from the cliché and easily transferred to the layer to be processed. The layer to be processed is composed of a metal layer, an insulating layer of $SiO_X$ or $SiN_X$, and a semiconductor layer has a surface processed either chemically or physically.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to preferred embodiments of the present invention, examples of which are illustrated in the accompanying drawings.

In the present invention, a printing process is used so as to form an active device pattern of a display device such as a liquid crystal display device. Particularly, a gravure offset printing process in which ink is poured into a concave plate and extra ink is etched for printing is a well known method in various fields such as a printing on packages, cellophane, vinyl, and polyethylene. In the present invention, an active device or a circuit pattern applied to the display device is fabricated by using the printing process.

The gravure offset printing transfers ink onto a substrate by using a transfer roll, so that a pattern can be formed by one time transfer even in case of a display device having a large area by using a transfer roll corresponding to a selected area of the display device. The gravure offset can be used in patterning various kinds of patterns of the display device, for example, not only a TFT but also a gate line, a data line, a pixel electrode connected to the TFT, and a metal pattern for a capacitor in the case of a liquid crystal display device.

Hereinafter, the method for forming a pattern according to the present invention will be explained with reference to attached drawings in more detail.

Figure 1:
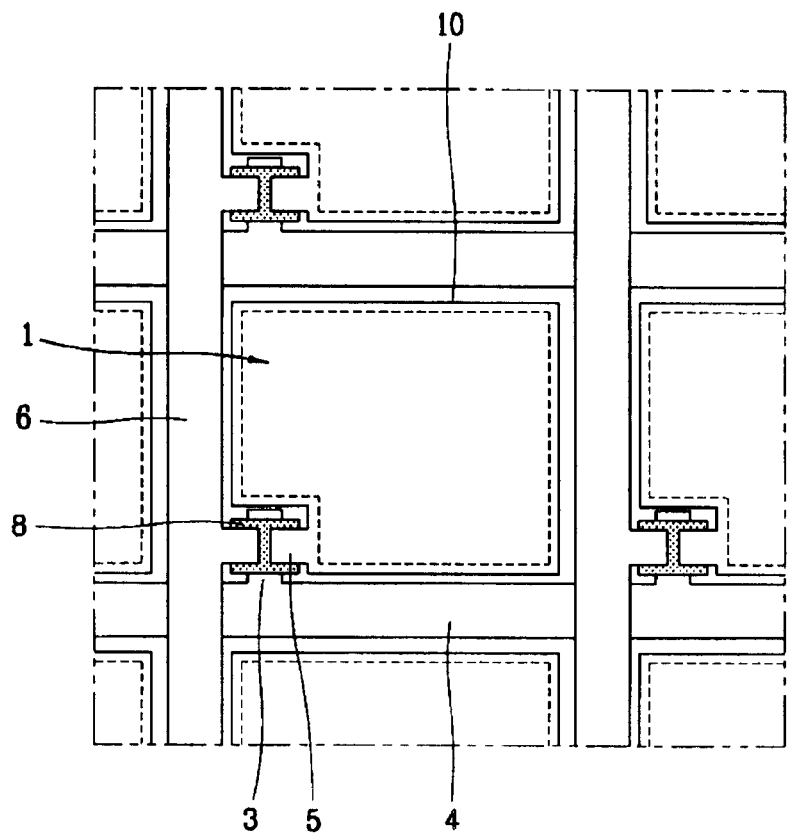
FIG. 1 is a plane view showing a general structure of a LCD device.
Figure 2:
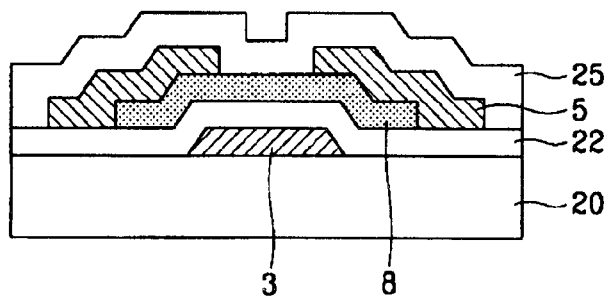
FIG. 2 is a sectional view showing a TFT structure of the LCD device illustrated in FIG. 1.
Figure 3A:
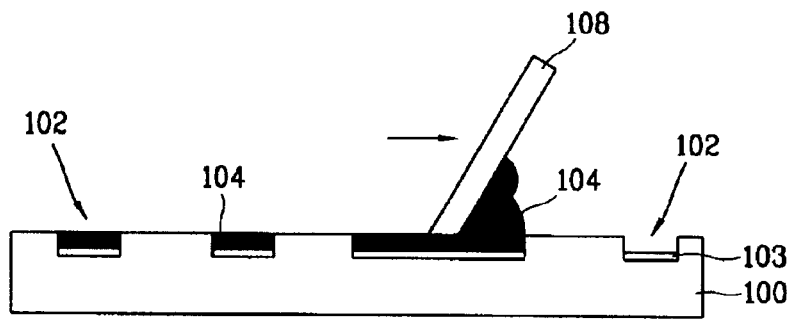
FIG. 3 is a view showing a method for forming a pattern by a gravure offset printing process according to the present invention.
Figure 3B:
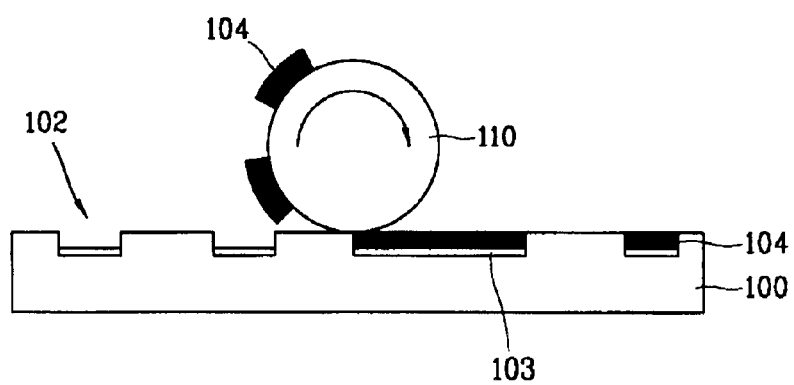
Figure 3C:
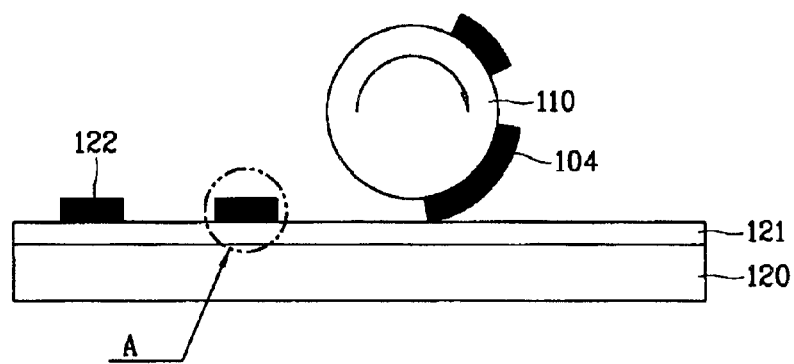

FIGS. 3a–3c are views showing a method for forming an ink pattern on a substrate by a printing process according to the present invention. As shown, a groove 102 is formed at a concave plate corresponding to a pattern to be formed on a substrate or a special location of a cliché 100, and then ink 104 is filled in the groove 102. The groove 102 formed at the cliché 100 is formed by a general photolithography method, and the filling of the ink 104 into the groove 102 is performed by depositing a pattern from ink 104 on the cliché 100 and then pushing a doctor blade 108 such that the doctor blade is in contact with a substrate 120. Accordingly, by progress of the doctor blade 108, the ink 104 is filled in the groove 102 and the ink 104 which remains at the surface of the cliché 100 is removed.

As shown in FIG. 3B, the ink 104 filled in the groove 102 of the cliché 100 is transferred to a surface of a transfer roll 110 which rotates while in contact with the surface of the cliché 100. The transfer roll 110 is formed having the same width as that of a panel of a display device to be fabricated, and has a circumference having the same length as that of the panel. Accordingly, the ink 104 filled in the groove 102 of the cliché 100 is all transferred to a circumferential surface of the transfer roll 110 by a one time rotation.

Then, as shown in FIG. 3C, as the transfer roll 110 is rotated in a state of being in contact with a surface of a layer 121 to be processed and formed on the substrate 120, the ink 104 transferred to the transfer roll 110 is transferred to the layer 121 to be processed and UV or heat is added to the transferred ink 104 to aid drying, thereby forming an ink pattern 122. At this time, it is also possible to form a desired pattern 122 over the entire substrate 120 of the display device by one rotation of the transfer roll 110.

As aforementioned, in the printing process, the cliché 100 and the transfer roll 110 can be fabricated according to a desired size of a display device, and the pattern can be formed on the substrate 120 by one transfer, thereby enabling formation of a pattern of a display device having a large area just by one event of processing.

The layer to be processed 121 can be a metal layer for forming a metal pattern such as a gate electrode or source/drain electrodes of a TFT, a gate line, a data line, or a pixel electrode, or can be an insulating layer such as $SiO_X$ or $SiN_X$.

In case of forming a substantial pattern of the display device, the ink pattern 122 functions as a resist does in the conventional photo processing. Accordingly, the ink pattern 122 is formed on the metal layer or the insulating layer and then the metal layer or the insulating layer is etched by a general etching process, thereby forming a metal layer (that is, an electrode structure) or an insulating layer (for example, a contact hole) of a desired pattern.

The above printing process has many advantages. Particularly, the ink pattern is generated on the display device having a large area by one-time processing and a pattern more complex than a pattern using conventional photolithography processing can be formed.

However, the gravure offset printing process was problematic in that the ink pattern 122 is easily detached from the layer 121 to be processed at the time of forming the ink pattern 122 by re-transfer of ink. The problem results from the following reasons.

First, the adhesive force between the layer to be processed 121 and the ink 104 is weak. The weakness of the adhesive force is due to an interfacial characteristic between the layer 121 composed of an insulating layer such as $SiO_X$ or $SiN_X$, or a semiconductor layer of Si and the ink 104. Second, when the ink is transferred from the cliché 100 to the transfer roll 110, the ink 104 is not smoothly detached from the groove 102 of the cliché 100. Accordingly, since some ink remains in the groove 102, a surface of the ink detached and transferred to the transfer roll 110 is not flat. Therefore, when the ink is re-transferred to the substrate 120, the adhesive force between the substrate 120 and the ink 104 is weakened, so that the ink pattern 122 is easily detached from the substrate 120.

By said reasons, in case that a part of the ink pattern 122 is detached from the layer 121 or if a gap is generated at an interface, when a pattern of the display device is formed by etching the layer 121 to be processed by a subsequent etching process, etching liquid flows into the detached part or the gap, thereby etching a part of the layer 121 that is not to be etched. Accordingly, in the display device requiring a pattern of high precision, said reasons work as critical reasons of a defect.

In the present invention, in order to solve the above-described problems, a method for enhancing adhesive force between the layer 121 and the ink 104 by processing the layer 121 chemically or physically is provided.

The method for processing the surface of the layer to be processed to enhance the adhesive force with the ink includes a chemical process method and a physical process method.

First, the chemical process method includes a method for depositing adhesive force intensifier, that is, primer, on the surface of the layer to be processed, a plasma process method, and a UV process method.

As materials of the primer, Hexa Methyl Disilazane (HMDS) having excellent adhesive force with ink, resin having an excellent adhesion characteristic, that is, polyethyleneimine, isocyanates based compound, polyester based resin and vinyl acetate based resin are used. When the HMDS such as the insulating layer like $SiO_X$ or $SiN_X$ or a semiconductor layer is deposited with vapor on the surface of the layer to be processed (121), a silicon group in the HMDS is chemically bound with the layer to be processed (121) and the methyl group is bound with the ink, thereby enhancing the adhesive force between the ink and the layer to be processed 121. Also, the above resins function as an adhesive between the ink and the layer to be processed 121, thereby greatly enhancing the adhesive force between the ink and the layer to be processed.

In said plasma process method, when gas such as $N_2$, $O_2$, He, and H is changed into a plasma state and then a plasma process is performed on the layer to be processed, COOH, CO, or OH groups to enhance the adhesive force with the ink are generated at the surface of the layer to be processed. Besides, since the surface of the layer to be processed 121 is meticulously etched after the plasma process, a surface area of the layer to be processed 121 in contact with the ink is widened, thereby increasing the adhesive force with the ink.

The UV process is a method to enhance the adhesive force between the ink and the layer to be processed 121 by irradiating UV to the ink on the layer 121 to be processed. In the UV process, like the aforementioned plasma process, a COOH or OH group is generated at the surface of the layer to be processed 121 after the UV process, thereby increasing the adhesive force with the ink.

The physical process is a method to increase a surface area of the layer to be processed 121 in contact with the ink by roughing the surface of the layer to be processed 121, thereby enhancing the adhesive force between the ink and the layer to be processed. The physical process method includes a corona discharge using a high voltage greater than about 4 KV and a sandblast method for spouting fine sand particles ($CaCO_3$) to the surface of the layer to be processed 121 with compression air from a nozzle.

Figure 4:
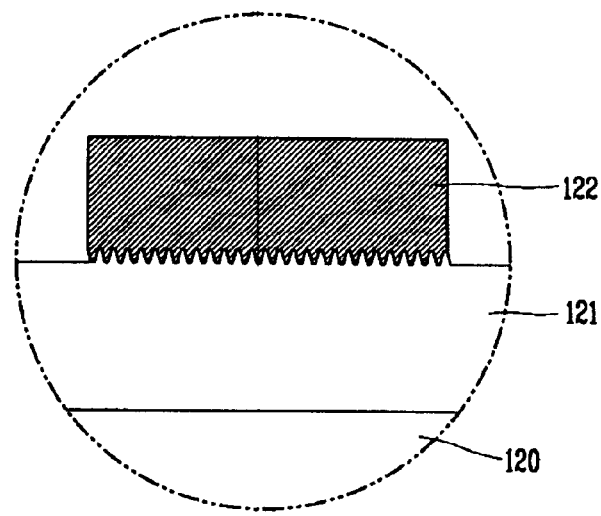
FIG. 4 is an enlarged view of A region in FIG. 3 in a case that a physical surface process is performed on a layer to be processed.

FIG. 4 is an enlarged view of A region in FIG. 3C showing an interface between the layer to be processed 121 and the ink 122 in case that the physical process is performed on a layer to be processed. As shown, as the surface of the layer to be processed 121 becomes bumpy due to a physical process such as the corona discharge process or the sandblast process, a surface area of the layer to be processed 121 in contact with the ink 122 is widened. As the surface area of the layer to be processed 121 in contact with the ink 122 is widened, the adhesive force between the ink 122 and the layer to be processed 121 is increased more than it is in a case wherein the layer to be processed 121 is flat.

Figure 5:
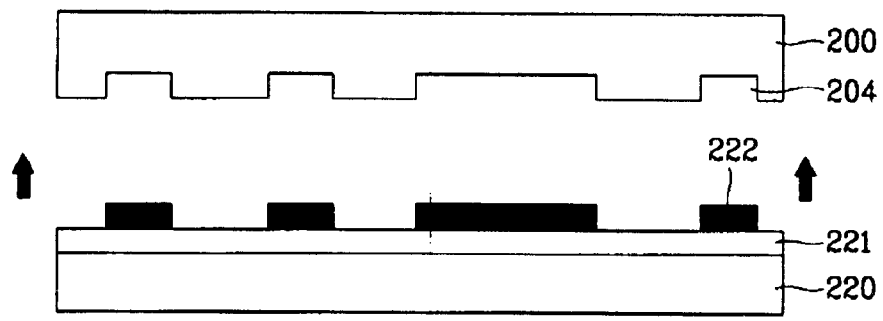
FIG. 5 is a view showing a method for forming a pattern by a direct contact printing process according to the present invention.

In the meantime, as a method for transferring the ink to the layer to be processed, there is also provided a method in which a cliché 200 filled with ink is directly contacted on a substrate 220 on which the layer to be processed 221 is formed and then detached again to form an ink pattern (222) on the layer to be processed 221 (in FIG. 5).

Also, to solve the problems of detachment between the cliché and the ink, in the present invention, additive for detachment for smoothly detaching the ink 104 from the groove 102 formed at the cliché 100 is used. The additive for detachment corresponding to a kind of detachment accelerant is coated between the groove 102 of the cliché 100 and the ink 104, thereby causing the ink 104 be detached from the cliché 100 smoothly even by a slight force. To this end, in FIG. 3, the additive for detachment 103 is coated in the groove 102 before depositing the ink 104 on the cliché 100 (even if the additive for detachment is coated only to a bottom of the groove in drawings, the additive for detachment is also coated to a lateral wall of the groove, substantially).

Also, in the present invention, the cliché 100 is formed with silicon based material such as $SiO_X$ for smooth detachment from the ink 104. Generally, since the ink 104 has hydrophobicity and the silicon based material has hydrophilicity, affinity between the ink and the silicon based material is weak. Accordingly, in case of forming the cliché 100 with the silicon based material, the ink can be smoothly detached from the cliché 100 based on low affinity. The low affinity between the silicon based material and the ink results in a weak adhesive force between the insulating layer to be processed such as $SiO_X$ or $SiN_X$ and the semiconductor layer to be processed, so that the HMDS processing has to be performed on the layer to be processed.

As aforementioned, in the present invention, the additive for detachment 103 is coated to the groove of the cliché 100 or the cliché 100 is formed with $SiO_X$ based material, so that the ink 104 is smoothly detached from the cliché 100 and thereby a precise ink pattern can be formed on the substrate 120 consistently. Also, since the layer to be processed 121 of the substrate 120 is processed with the HMDS, the ink pattern 122 re-transferred from the transfer roll 110 is prevented from being detached from the layer to be processed 121. By said processes of the present invention, the minute ink pattern 122 can be formed on the substrate 120, thereby fabricating the display device having a large area with a minute pattern.

Figure 6:
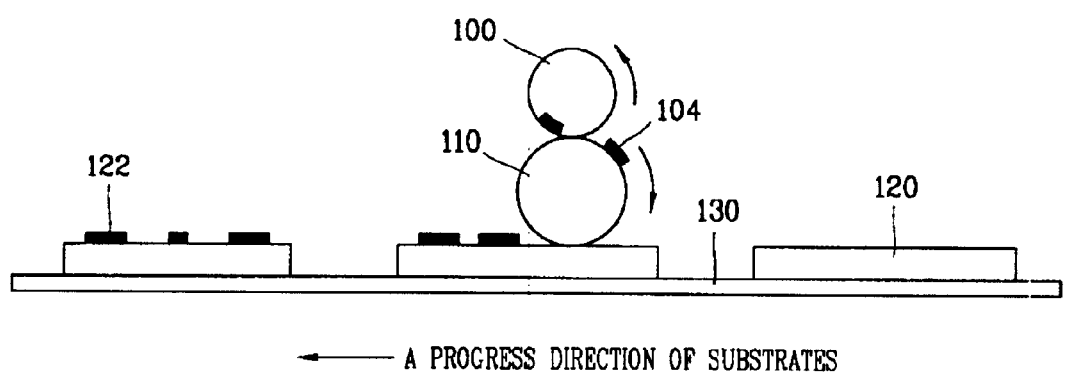
FIG. 6 is a view showing that the gravure printing process of FIG. 3 is applied to an actual production line.

FIG. 6 is a view showing a case in which the gravure printing process is applied to an actual production line. Reference numeral 130 denotes a belt, which progresses in the direction shown by the arrow. On the belt, a substrate 120, for example, a liquid crystal panel in a production line of a LCD device, progresses in the progression direction of the belt.

As shown, the cliché 100 is formed in a roll shape in a substantial production line, thereby being in contact with the transfer roll 110. As the belt 130 progresses, the substrate 120 progresses to be placed in contact with the transfer roll 110 and the transfer roll 110 is rotated with a speed corresponding to a progression speed of the belt 130. In the meantime, the cliché 100 is also rotated with the rotation of the transfer roll 110, so that the ink 104 filled in the groove (not shown) of the cliché 100 is transferred to the transfer roll 110 and the transferred ink 104 is re-transferred to the substrate, thereby forming the ink pattern 122.

When a printing of the ink pattern on one substrate is finished, a next substrate 120 arranged at the belt 130 is inputted to the transfer roll 110 again and the same processes are repeated, thereby printing on plural substrates by consecutive processes.

The substrate on which the ink pattern 122 is formed is transported to a subsequent line and the next photo process is performed, thereby forming a minute pattern of the display device.

The method for forming a pattern by said printing method can be used not only on an active device of the display device such as a LCD device and a circuit but also in forming devices on a semiconductor wafer. Also, the additive for detachment used in the present invention is not limited to a particular material, but includes all materials corresponding to detachment accelerant which smoothly detaches the ink and layer to be processed.

As aforementioned, the present invention has the following advantages. First, in the gravure printing process used at the time of forming a pattern of the display device, since the cliché is formed with the silicon based material and the additive for detachment for accelerating the detachment is coated to an inner portion of the cliché filled with the ink, the ink is smoothly detached from the cliché, thereby precisely forming a desired pattern. Second, the layer to be processed such as the insulating layer or the semiconductor layer which is stacked on the substrate and etched by a subsequent process is surface-processed, thereby preventing the ink pattern to be printed from being detached from the layer to be processed. As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. A method for forming a pattern comprising the steps of:
   coating an additive for detachment in a groove of a cliché (offset plate) corresponding to a location of a pattern to be formed;
   filling in the groove with ink; and
   transferring the ink filled in the groove of the cliché to a layer to be processed.

2. The method of claim 1, wherein the step for transferring the ink to the layer to be processed includes the steps of:
   contacting the cliché filled with the ink with the layer to be processed; and
   detaching the cliché from the layer to be processed and then transferring ink to the layer to be processed.

3. The method of claim 1, wherein the step of transferring ink to the layer to be processed includes the steps of:
   transferring the ink filled in the groove to a surface of a transfer roll by rotating the transfer roll on the cliché; and
   re-transferring the ink at the surface of the transfer roll to the layer to be processed by rotating the transfer roll on said layer of a substrate.

4. The method of claim 3, wherein the cliché is formed in a roll shape and brought into contact with the transfer roll.

5. The method of claim 1, wherein the additive for detachment is a detachment accelerant.

6. The method of claim 1, wherein the cliché is formed of a silicon based material.

7. The method of claim 1, wherein the layer to be processed includes a metal layer.

8. The method of claim 1, wherein the layer to be processed includes an insulating layer composed of $SiO_X$ or $SiN_X$.

9. The method of claim 1, wherein the layer to be processed is a semiconductor layer.

10. The method of claim 1, wherein the surface of the layer to be processed is processed by an adhesive force intensifier.

11. The method of claim 10, wherein the adhesive force intensifier is Hexa Methyl Disilazane (HMDS).

12. The method of claim 10, wherein the surface of the layer to be processed is processed by the Hexa Methyl Disilazane (HMDS).

13. The method of claim 10, wherein the layer to be processed is selected from the group consisting of polyethyleneimine, an isocyanates based compound, a polyester based resin and a vinyl acetate based resin.

14. The method of claim 1, wherein the surface of the layer to be processed is processed by a plasma method.

15. The method of claim 1, wherein the surface of the layer to be processed is processed by a UV method.

16. The method of claim 1, wherein the surface of the layer to be processed is processed by a sandblast method.

17. The method of claim 1, further comprising a step of forming an ink pattern by drying ink re-transferred to the layer to be processed.

18. A method for forming a pattern comprising the steps of:
   coating an additive for detachment in a groove of a cliché (offset plate) corresponding to a location of a pattern to be formed;
   filling ink into the groove;
   transferring the ink filled in the groove to a surface of a transfer roll by rotating the transfer roll on the cliché; and
   re-transferring the ink at the surface of the transfer roll to the layer to be processed by rotating the transfer roll in a manner such that the transfer roll is contacted with the layer to be processed of a substrate.

19. A method for forming a pattern comprising the steps of:
   depositing detachment accelerant in a groove of a cliché corresponding to a pattern location to be formed;
   filling ink into the groove;
   contacting the cliché filled with the ink with a substrate; and
   detaching the cliché from the layer to be processed, thereby transferring ink to the layer to be processed.

* * * * *